: US 6,919,249 B2
(45) Date of Patent: Jul. 19, 2005

(54) SEMICONDUCTOR DEVICE AND ITS MANUFACTURING METHOD COMPRISING A TRENCH GATE

(75) Inventors: Takahiro Kawano, Kanagawa (JP); Tatsuo Yoneda, Hyogo (JP); Hirobumi Matsuki, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/778,072

(22) Filed: Feb. 17, 2004

(65) Prior Publication Data

US 2004/0159885 A1 Aug. 19, 2004

Related U.S. Application Data

(62) Division of application No. 10/246,468, filed on Sep. 19, 2002, now Pat. No. 6,750,511.

(30) Foreign Application Priority Data

Sep. 19, 2001 (JP) ........................................ 2001-285254

(51) Int. Cl.[7] .................... H01L 21/8238; H01L 21/336
(52) U.S. Cl. ........................ 438/270; 438/206; 438/212; 438/268
(58) Field of Search ............................ 438/212, 268, 438/206, 270

(56) References Cited

U.S. PATENT DOCUMENTS 5,021,845 A 6/1991 Hashimoto
5,371,024 A * 12/1994 Hieda et al. ................. 438/291
5,429,970 A * 7/1995 Hong .......................... 438/259
5,640,034 A 6/1997 Malhi
6,151,488 A * 11/2000 Brekelmans .............. 455/150.1
6,188,105 B1 2/2001 Kocon et al.
6,262,470 B1 7/2001 Lee et al.
6,365,942 B1 * 4/2002 Kocon et al. ................ 257/376
6,475,864 B1 * 11/2002 Sato et al. ................... 438/268
6,534,828 B1 3/2003 Kocon
6,569,738 B2 * 5/2003 Darwish ...................... 438/270
6,639,269 B1 * 10/2003 Hofmann et al. ............ 257/316
6,756,272 B1 * 6/2004 Nakagawa ................... 438/264

FOREIGN PATENT DOCUMENTS

JP          9-260663         10/1997

* cited by examiner

Primary Examiner—Michael Lebentritt
Assistant Examiner—Ron Pompey
(74) Attorney, Agent, or Firm—Oblon, Spivak, McClelland, Maier & Neustadt, P.C.

(57) ABSTRACT

A semiconductor device comprises a semiconductor layer of a first conductivity type (2), a base region (3) formed proximal to the semiconductor layer, a source region (4) selectively placed over the base region, trenches (T), a gate insulating layer (7) and a gate electrode (6) provided on an inner wall of each of the trenches, and a source electrode (9) connected to the source region. The source region is higher in impurity concentration in a contact (4a) with the source electrode than in a contact with the gate insulating layer, and it is also higher in impurity concentration in the contact (4a) with the source electrode than in a contact with the base region.

4 Claims, 9 Drawing Sheets

SEMICONDUCTOR DEVICE AND ITS MANUFACTURING METHOD COMPRISING A TRENCH GATE

CROSS-REFERENCE TO RELATED APPLICATIONS

This application is a division of and claims the benefit of priority under 35 USC § 120 from U.S. application Ser. No. 10/246,468, filed Sep. 19, 2002 now U.S. Pat. No. 6,750,511 and is based upon and claims the benefit of priority under 35 USC § 119 from Japanese Patent Application No. 2001-285254, filed on Sep. 19, 2001; the entire contents of which are incorporated herein by reference.

BACKGROUND OF THE INVENTION

The present invention relates to a semiconductor device and a method of manufacturing the same, and more particularly, it relates to a semiconductor device suitably applied to a trench-gate MOSFET (Metal Oxide Semiconductor Field Effect Transistor) for power control, and a method of manufacturing such a semiconductor device.

Semiconductor devices commonly used for power control include various power MOSFETs (Field Effect Transistors) and MOS type transistors such as IGBT (Insulated Gate Bipolar Transistor). In these semiconductor devices, it is desired to reduce conductive loss during the switching operation and also to attain low capacitive property as well.

One prospective solution to satisfy such requirements is "trench-gate structure".

FIG. 10 is a diagram showing a main portion of an exemplary cross-sectional structure of a test trench-gate power MOSFET that is embodied for a trial by the inventors of the present invention in the course of attempting to make the invention complete.

Specifically, the MOSFET shown in the drawing has a configuration where an n$^+$-type semiconductor substrate 101 is superposed with an n$^-$-type epitaxial semiconductor layer 2, a p-type base region 103, and an n$^+$-type source region 104 one over another in this order. Then, trenches T are defined in such a multi-layered structure, extending perpendicular to a stacking direction of the layers, and each of the trenches has its inner wall coated with gate insulating film 107 and is further filled with polysilicon serving as a gate electrode 106. The source region 104 is selectively removed between adjacent ones of the trenches to create a recessed portion reaching the base region 103, and thereafter, an additional p$^+$-type region 105 is selectively formed in the exposed surface of the base region.

The gate electrode 106 and the gate insulating film 107 are covered with interlayer insulating film 108 while the source region 104 has its exposed portion been in contact with source electrode 109 deposited thereover. In an underside of the substrate 101, there is a drain electrode 110.

Although only a cell segment corresponding to the single trench is depicted in FIG. 10, a device often includes a plurality of such cells in an array, each having the trench.

In the trench-gate structure as mentioned above, the device, when miniaturized having an increased number of trench-gates, meets a corresponding increase in the total channel width, and this enables its ON-resistance to be reduced.

Such a reduction of the ON-resistance in the device by virtue of a miniaturization of itself is well explained by the following background principle. In general, components of an ON-resistance in a transistor include a resistance of a high concentration substrate, a resistance of epitaxial layer, a channel resistance, a source resistance, a contact resistance, and the like. Especially, MOSFETs of low withstand voltage of 100V or below have an ON-resistance a large percentage of which is a resistance component of a channel region. For instance, approximately 20% of the total resistance is a channel resistance in a MOSFET of 100 V withstand voltage, and the value reaches as high as about 60% in a MOSFET of 30 V withstand voltage. Thus, it is considerably effective for a decrease in the ON-resistance to increase a channel density by miniaturizing the cell segment.

One deliberate solution to attain a decrease in ON-resistance in the device or a decrease in conductive loss is miniaturizing the device by reducing a pitch between cells.

On the other hand, a low capacitive property is enhanced in an improved manner of decreasing depths of both the p-type base region 3 and the trench gates.

However, an enhanced integration which is an advantageous feature of the trench-gate structure brings about the best result for the reduction of the ON-resistance but leads to an adverse effect upon a durability against breakdown, namely, "avalanche tolerability" of the device.

A definition of the term "avalanche tolerability" herein can be summed up as follows.

When the MOSFET as shown in FIG. 10 is turned off, a current path is short-circuited between a gate G and a source S to reduce a voltage $V_{GS}$ applied across the path between gate G and the source S down to 0 V. At this time, when $V_{GS}$ reaches a threshold voltage or below, a channel disappears. Since the current path is shut off, a drain current $I_D$ reaches 0 A, and this variation in current permits a load having an inductance to develop counter electromotive power which is applied to a drain D. The applied electromotive force turns a diode of the n$^-$-type epitaxial layer 102 and the p-type base region 103 to reversely biased to break the device down.

The n-type source region 104, the p-type base region 103, and the n-type epitaxial layer 102 of the MOSFET constitutes a parasitic n-p-n bipolar transistor. The p-type base region 103 serving as a base of the bipolar transistor has a parasitic resistance $R_B$. The breakdown current, which is caused as a result of turning the MOSFET off, flows into the n-type semiconductor substrate 101, the n-type epitaxial layer 102, and the p-type base region 103, respectively, and this causes the bipolar transistor to turn on. A large base resistance causes a large forward bias between the base and the emitter. In a cell(s) under an influence of such bipolar operation, a generation of heat results in positively charged electron holes being produced, and this further accelerates a heat generation. In the cell(s) suffered from such circulation, current concentratively overflows to eventually cause breakdown. This is called "avalanche breakdown".

Recently, the industry has more increasingly demanded MOSFETs of more accelerated operation and higher frequency operation for applications of switching power supply, AC-DC converter, and the like. To address such demands, it is desirable that the device would not easily be broken down by surge voltage of reduced pulse width caused during the accelerated operation and/or the high frequency operation; in other words, the device should desirably have enhanced durability against avalanche breakdown.

A solution to the "avalanche breakdown" is a "trench contact technology" as shown in FIG. 10 where the additional p$^+$-type region 105 is created by raising a base concentration in part of the base region 103, thereby decreasing a base resistance of the parasitic transistor (e.g., n-p-n type for the n-channel) to have a well-balanced operation.

With such a solution, however, there still arises a problem that a junction of the source region 104 with the source electrode 109, or any trench contact TC, is likely to cause ohmic malfunction due to unsteadiness of the processing, which, in turn, results in a greater liability to uneven ON-resistance.

In attempting to avoid the avalanche breakdown, it has been found that a decrease in a concentration of the source region 104 is effectual to control the parasitic transistor for a well-balanced bipolar operation.

However, this way of decreasing the concentration of the source region 104 also causes a problem that an ohmic contact with the source electrode 109 becomes further unsatisfied, which results in the ON-resistance rising.

Thus, there exist a necessity of providing a renovated trench-gate MOSFET semiconductor device that has an improved avalanche tolerability as well as a reduced ON-resistance, and a necessity, as well, of providing a method of manufacturing such a semiconductor device.

SUMMARY OF THE INVENTION

In one aspect, a semiconductor device according to the embodiment of the present invention comprises: a semiconductor layer of a first conductivity type; a semiconductor region of a second conductivity type formed on the semiconductor layer; a semiconductor region of a first conductivity type selectively provided on the semiconductor region of the second conductivity type; a trench extending from the semiconductor region of the first conductivity type through the semiconductor region of the second conductivity type to the semiconductor layer of the first conductivity type; an insulating layer provided over an inner wall of the trench; a conductor embedded in a space defined by the insulating layer in the trench; and an electrode connected to the semiconductor region of the first conductivity type, the semiconductor region of the first conductivity type having a portion in contact with the electrode, the portion having a higher concentration of impurity of the first conductivity type than a remaining portion of the semiconductor region of the first conductivity type.

The "region higher in concentration of impurity of the first conductivity type" herein is defined as a region of which impurity concentration reaches a sufficient level to permit a formation of ohmic contact with the electrode.

In another aspect, a semiconductor device according to the embodiment of the present invention comprises: a semiconductor layer of a first conductivity type; a semiconductor region of a second conductivity type formed on the semiconductor layer; a semiconductor region of a first conductivity type selectively provided on the semiconductor region of the second conductivity type; a trench extending from the semiconductor region of the first conductivity type through the semiconductor region of the second conductivity type to the semiconductor layer of the first conductivity type; an insulating layer provided over an inner wall of the trench; a conductor embedded in a space defined by the insulating layer in the trench; and an electrode connected to the semiconductor region of the first conductivity type, the semiconductor region of the first conductivity type having a concentration distribution of the impurity of the first conductivity which is higher at a part in contact with the electrode than at a part in contact with the insulating layer.

In another aspect, a semiconductor device according to the embodiment of the present invention comprises: a semiconductor layer of a first conductivity type; a base region of a second conductivity type formed on the semiconductor layer; a source region of a first conductivity type selectively provided on the base region; a trench extending from the source region through the base region to the semiconductor layer; an gate insulating layer provided over an inner wall of the trench; a gate electrode embedded in a space defined by the gate insulating layer in the trench; and a source electrode connected to the source region, the source region having a concentration distribution of the impurity of the first conductivity which is higher at a part in contact with the source electrode than at a part in contact with the gate insulating layer, and the source region having a concentration distribution of the impurity of the first conductivity which is higher at the part in contact with the source electrode than at a part in contact with the base region.

A method of manufacturing a semiconductor device according to the embodiment of the present invention comprises: forming a multi-layered structure including a semiconductor layer of a first conductivity type, a semiconductor region of a second conductivity type, a semiconductor region of a first conductivity type one over another in this order; forming a trench which extends from the semiconductor region of the first conductivity type through the semiconductor region of the second conductivity type to the semiconductor layer of the first conductivity type; forming an insulating layer over an inner wall of the trench; embedding a conductor in a space defined by the insulating layer in the trench; introducing impurity of the first conductivity type into part of a surface of the semiconductor region of the first conductivity, the part being apart from the trench, so as to from a region higher in concentration of which deepest level does not reach the underlying semiconductor region of the second conductivity type, partially etching away the region higher in concentration to expose the semiconductor region of the second conductivity type; and connecting an electrode to the region higher in concentration and to the exposed portion of the semiconductor region of the second conductivity type.

BRIEF DESCRIPTION OF THE DRAWINGS

The present invention will be understood more fully from the detailed description given herebelow and from the accompanying drawings of the embodiments of the invention. However, the drawings are not intended to imply limitation of the invention to a specific embodiment, but are for explanation and understanding only.

In the drawings.

DETAILED DESCRIPTION

Referring to the accompanying drawings, embodiments of the present invention will now be described in detail.

Figure 1:
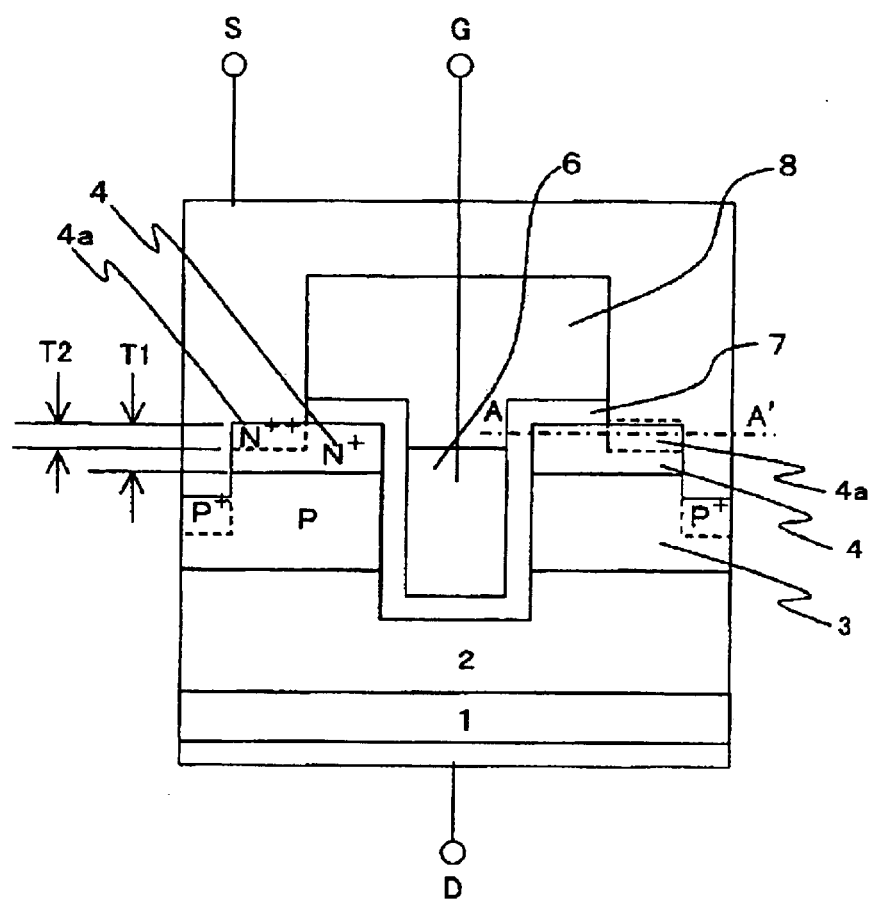
FIG. 1 is a diagram showing a major portion of a cross sectional structure of an exemplary semiconductor device according to the embodiment of the present invention.

FIG. 1 is a diagram illustrating a major portion of a sectional structure of an exemplary semiconductor device according to the embodiment of the present invention. This figure depicts a trench-gate n-channel MOSFET.

Figure 10:
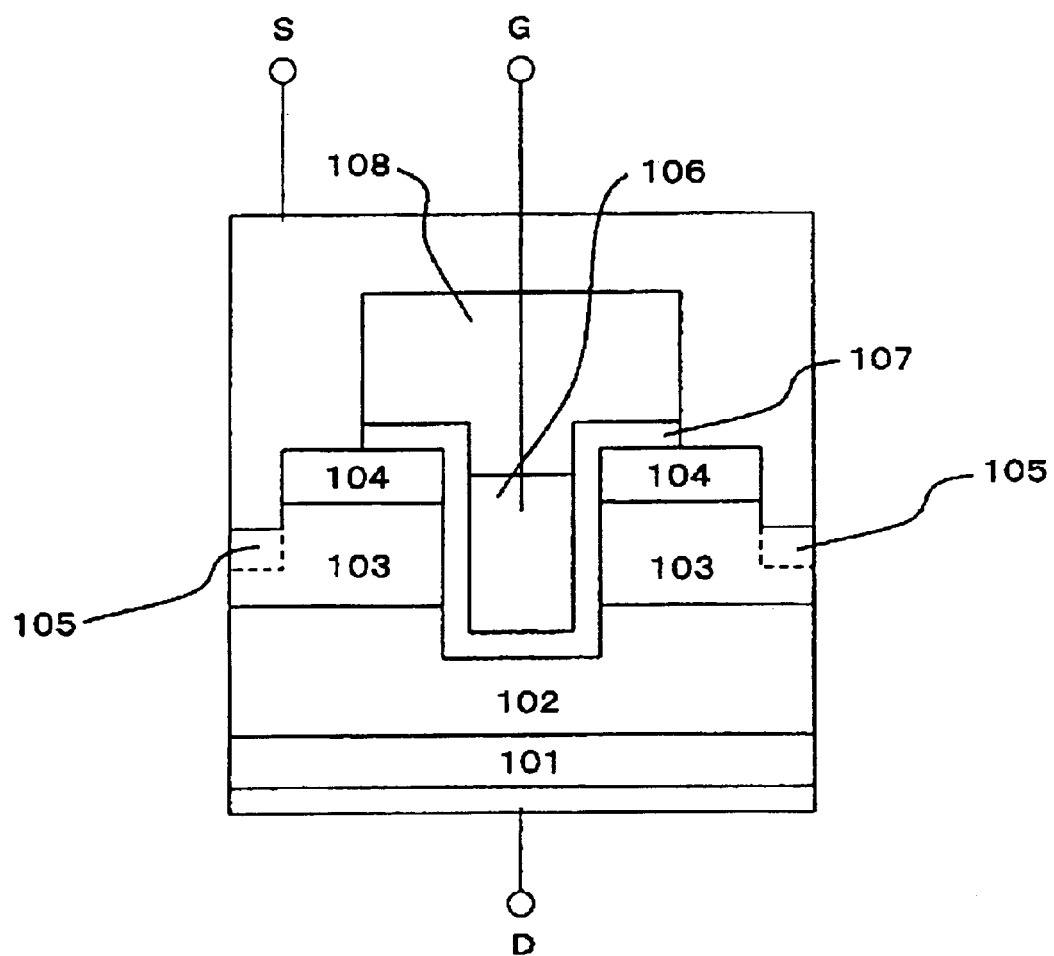
FIG. 10 is a diagram illustrating a major portion of a sectional structure of a test power MOSFET having a trench-gate configuration.

Compared with the MOSFET shown in FIG. 10, the MOSFET according to the embodiment of the present invention has a higher concentration $n^{++}$-type region 4a in a junction of an $n^+$-type source region 4 with a source electrode 9.

The MOSFET in FIG. 1 is as a whole configured as explained below. An $n^+$-type semiconductor substrate 1 is superposed with an $n^-$-type epitaxial semiconductor layer 2, a p-type base regions 3, and the $n^+$-type source region 4 one over another in this order. Trenches are defined in this multi-layered structure, extending perpendicular to a stacking direction of the layers, and each of the trenches has an inner wall coated with an gate insulating film 7 and then is filled with material serving as a gate electrode 6. The source region 4 is selectively removed between adjacent ones of the trenches, and the $n^{++}$-type source region 4a is provided in each of exposed corners of the remaining source region while an additional $p^+$-type region 5 is selectively formed in the exposed surface of the base region 3.

The gate electrode 6 and the gate insulating film 7 are covered with interlayer insulating film 8, and a source electrode 9 is provided in contact with the $n^{++}$-type source region 4a and the additional $p^+$-type region 5. A drain electrode 10 is provided in an underside of the substrate 1.

Configured as has been described, the device has its $n^+$-type source region 4 transformed in part to the higher concentration $n^{++}$-type source region 4a, and it is capable of avoiding avalanche breakdown while effectively reducing an ON-resistance therein.

Especially, in contrast with the comparison embodiment configured as in FIG. 10, the comparison structure has the source region 104 of approximately $1.3 \times 10^{19}$ cm$^{-3}$ in carrier concentration. This concentration is an optimum value resulted from a tradeoff between the avalanche breakdown and the ON-resistance, and a concentration level below the value causes an insufficient ON-resistance while the level above the value causes an insufficient avalanche withstand voltage.

In contrast, the embodiment of the present invention has the source region 4 of a concentration as low as $5 \times 10^{18}$ cm$^{-3}$ or possibly even lower, and it also has the $n^{++}$-type source region 4a of $5 \times 10^{19}$ cm$^{-3}$ in concentration or possibly even higher. As a consequence, a reduction of the concentration of the source region 4 brings about an improved avalanche withstand voltage relative to the comparison embodiment, and similarly, a provision of the higher concentration $n^{++}$-type source region 4a results in a reduced ON-resistance relative to the comparison embodiment.

In addition to the improved feature stated above, the embodiment of the present invention includes the higher concentration $n^{++}$-type source region 4a which is not in direct contact with the p-type base region 3 but has the source region 4 interposed.

When the higher concentration $n^{++}$-type source region 4a is applied in direct contact with the base region 3, an interface between them becomes a p-n junction showing a steep concentration gradient, which is more likely to cause avalanche effect during the parasitic bipolar operation. For that reason, isolating the $n^{++}$-type source region 4a from the base region 3 totally wipes away the probability of the steep gradient in the p-n junction between the source and the base.

In one preparatory embodiment of the inventors, for instance, when the $n^+$-type source region 4 has a film thickness T1 of 0.3 μm, the $n^{++}$-type source region 4a should have a film thickness T2 of approximately 0.1 μm to 0.15 μm to attain a satisfactory device property.

The semiconductor device shown in FIG. 1 will now be further detailed, referring to a method of manufacturing the same.

FIGS. 2A through 6 are cross sectional views showing a stepwise procedure of manufacturing a main portion of the exemplary semiconductor device of the embodiment of the present invention.

Figure 2A:
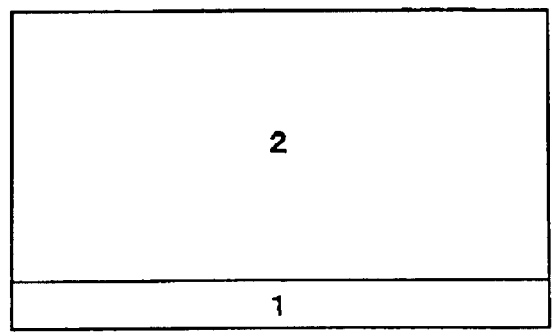
FIGS. 2A through 2C are vertical sectional views illustrating a stepwise procedure of manufacturing the major portion of the exemplary semiconductor device according to the embodiment of the present invention.

First, as shown in FIG. 2A, a major surface of the $n^+$-type silicon semiconductor substrate 1, which is of $10^{20}$ cm$^{-3}$ in impurity concentration, is superposed through vapor deposition with the $n^-$-type epitaxial layer 2 having an impurity concentration as high as $10^{16}$ cm$^{-3}$.

Figure 2B:
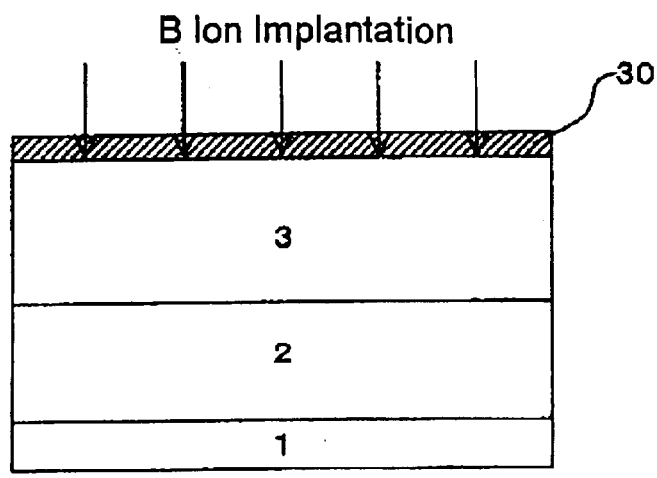

Then, as recognized in FIG. 2B, the base region 3 is formed. Specifically, the $n^-$-type epitaxial layer 2 has its surface coated with an oxidation film 30, and thereafter, p-type impurity ions such as boron B are injected and diffused in the surface of the $n^-$-type epitaxial layer 2 by means of ion implantation to create the p-type base region 3.

Figure 2C:
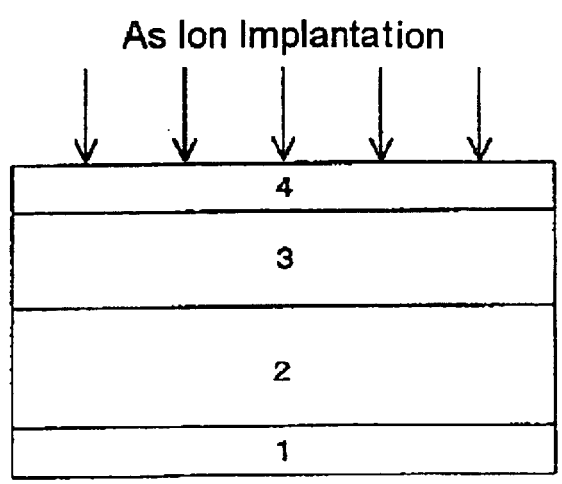

Next, as can be seen in FIG. 2C, a dose of $2 \times 10^{15}$ cm$^{-2}$, for example, of n-type impurity ions such as arsenic (As) is injected and diffused by means of ion implantation to create the $n^+$-type source region 4 having an impurity concentration as high as $5 \times 10^{18}$ cm$^{-3}$. In the comparison embodiment structured as in FIG. 10, for instance, a dose as much as $5 \times 10^{15}$ cm$^{-2}$ is used in the corresponding process step, and the resultant source region 104 has a concentration no less than $1.4 \times 10^{19}$ cm$^{-3}$. As later explained in detail with reference to FIG. 7, a concentration of the source region 104 in the comparison embodiment is at an insufficient level to reduce the avalanche withstand voltage and to create the ohmic contact with the source electrode 109.

Figure 3A:
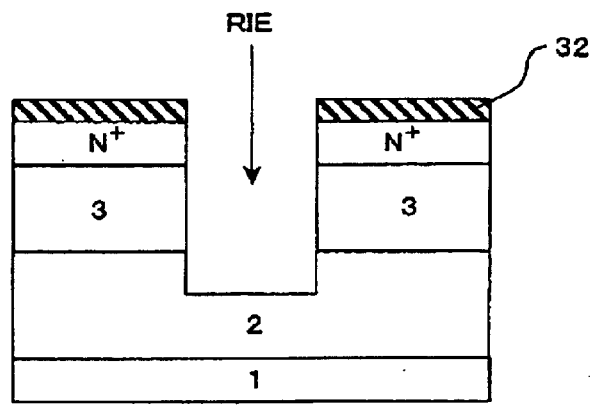
FIGS. 3A through 3C are vertical sectional views illustrating the stepwise procedure of manufacturing the major portion of the exemplary semiconductor device according to the embodiment of the present invention.

Further, as shown in FIG. 3A, a PEP (photo-engraving process) technique is utilized to provide resist mask 32 over the surface of the $n^+$-type source region 4, and then, by means of RIE (reactive ion etching), the surface material is dry-etched away till the $n^-$-type epitaxial layer 2 is exposed, thereby defining a trench T in a gate-trench region.

Figure 3B:
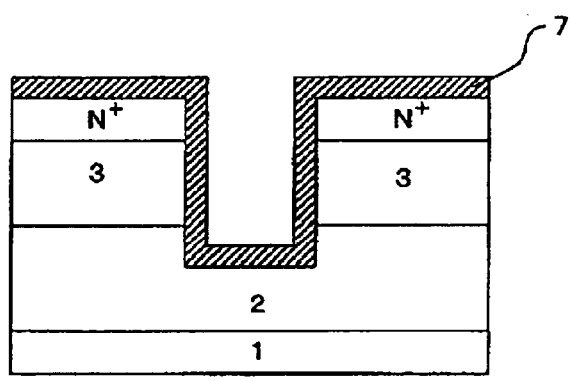

Additionally, as shown in FIG. 3B, the resist mask 32 patterned through the PEP technique is removed, and then, an inner wall of the trench T and a surface contiguous area thereto throughout the n⁻-type epitaxial layer 2 and the n⁺-type source region 4 are all coated with insulating gate oxidation film 7.

Figure 3C:
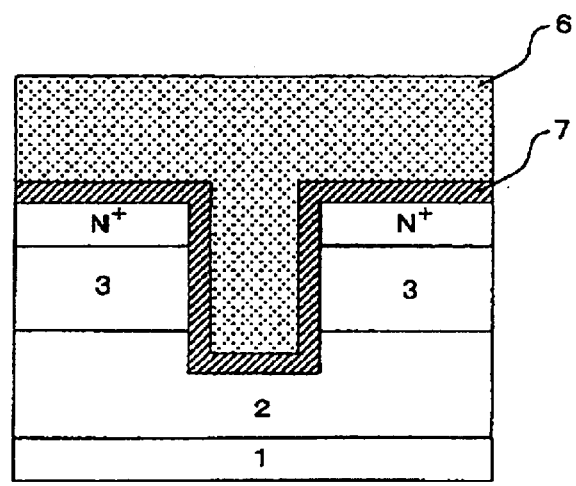

Then, as can be seen in FIG. 3C, polysilicon doped with the n-type impurity up to a higher concentration is deposited to fully fill gutter of the gate trench T to form a gate electrode 6.

Figure 4A:
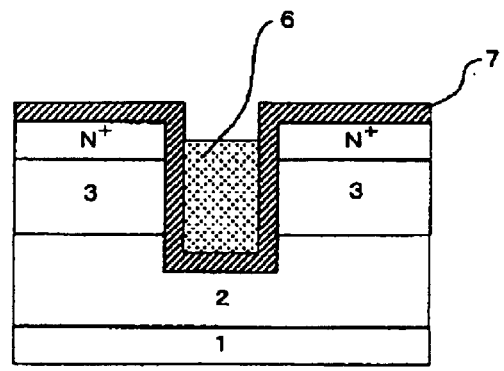
FIGS. 4A through 4C are vertical sectional views illustrating the stepwise procedure of manufacturing the major portion of the exemplary semiconductor device according to the embodiment of the present invention.

Moreover, as shown in FIG. 4A, the polysilicon deposited on the wafer surface is partially etched by means of RIE or the like and left only within the gate trench T to be the embedded gate electrode 6. The polysilicon must not be etched away down to a level of the p-type base region 3.

Figure 4B:
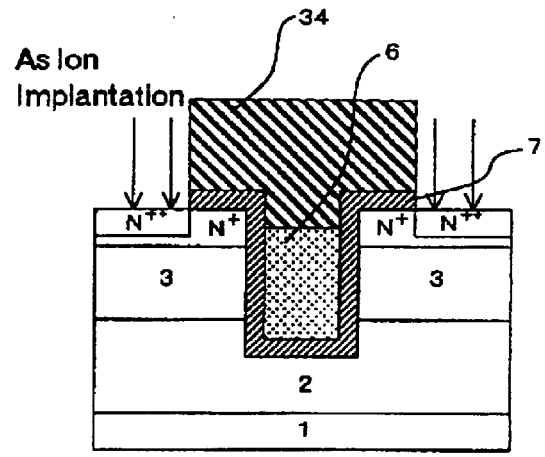

As can be seen in FIG. 4B, the PEP technique is utilized to form resist mask 34, and the gate oxidation film 7 is etched away from a region having no resist thereover. Thus, the corresponding surface of the n⁺-type source region 4 is exposed through openings, and the high concentration n-type impurity such as arsenic is injected and diffused by means of ion implantation to create the n⁺⁺-type source region 4a. In this embodiment, for instance, injecting a dose of $1\times10^{15}$ cm$^{-2}$ of arsenic ions permits the resultant n⁺⁺-type source region 4a to have a concentration no less than $5.5\times10^{19}$ cm$^{-3}$.

Figure 4C:
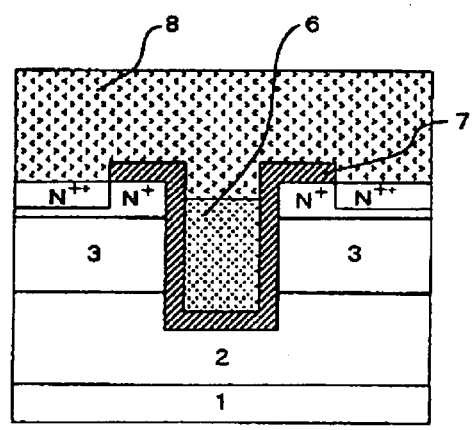

Further, as shown in FIG. 4C, after the resist mask 34 is removed, the entire wafer surface is covered with an insulating interlayer film 8 by means of CVD (chemical vapor deposition), for example.

Figure 5A:
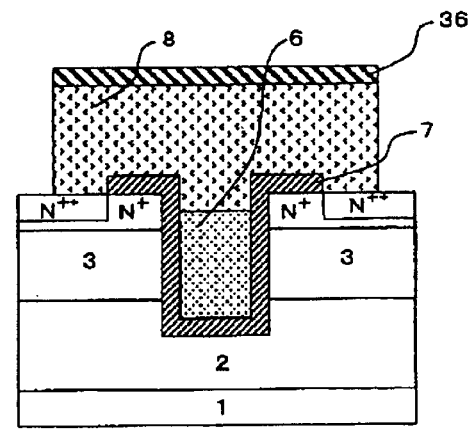
FIGS. 5A through 5C are vertical sectional views illustrating the stepwise procedure of manufacturing the major portion of the exemplary semiconductor device according to the embodiment of the present invention.

As illustrated in FIG. 5A, next, the PEP technique is utilized to form resist mask 36 and pattern the surface of the insulating interlayer film 8 so as to have an opening defined to make a contact with a p⁺-type source electrode. Then, the insulating interlayer film 8 is etched to make the n⁺⁺-type source region 4a exposed.

Figure 5B:
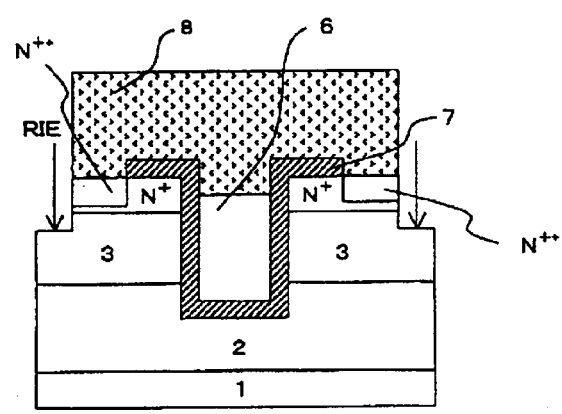

After that, as shown in FIG. 5B, the resist mask 36 is dry-etched away by means of the RIE while simultaneously the p-type base region 3 is exposed. In this step, the surface material is etched away down to a certain depth of the p-type base region 3, or alternatively, the n⁺⁺-type source region 4a and the n⁺-type source region 4 may be etched down to the uppermost level of the p-type base region 3.

Figure 5C:
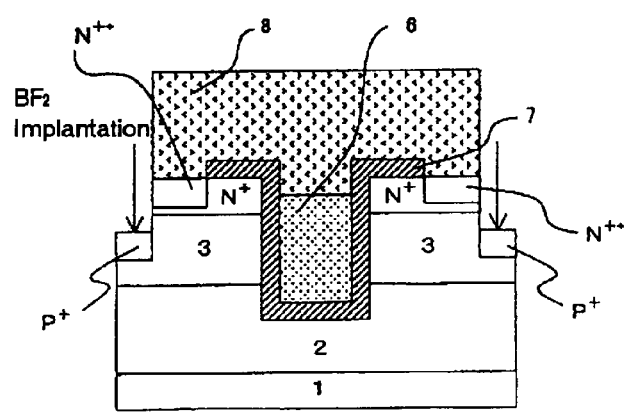

Then, as can be seen in FIG. 5C, high concentration p-type type impurity ions such as BF₂ are injected and diffused by means of ion implantation to form an additional p⁺-type region 5.

Figure 6:
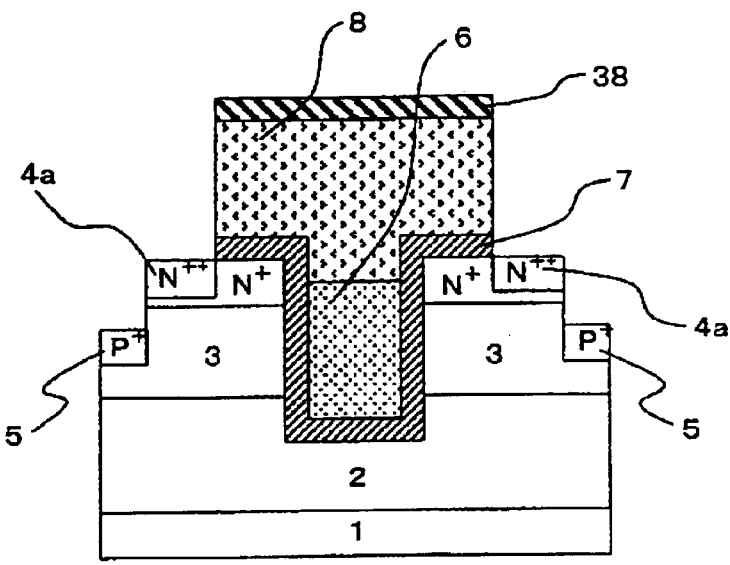
FIG. 6 is a vertical sectional view illustrating the stepwise procedure of manufacturing the major portion of the exemplary semiconductor device according to the embodiment of the present invention.

FIG. 6 depicts resist mask 38 formed by the PEP technique in a pattern having an opening defined in a region that is to serve as a contact with the source electrode. The insulating interlayer film 8 is selectively etched away to expose the surface of the n⁺⁺-type source region 4a. After that, the source electrode 9 is deposited to form a source contact. In the underside of the substrate 1, a drain electrode is created.

Figure 7:
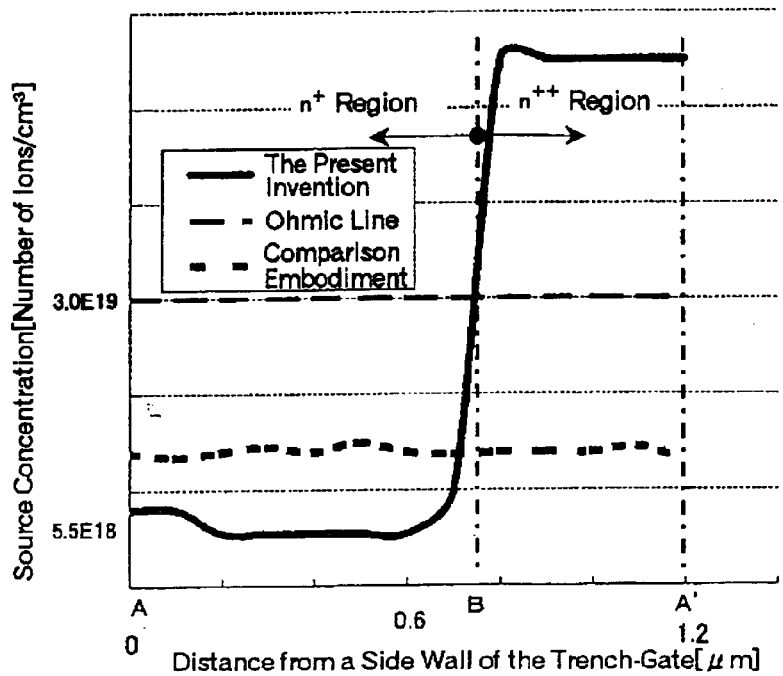
FIG. 7 depicts a profile representing a concentration distribution in a MOSFET source region in the embodiment of the present invention.

FIG. 7 depicts a profile representing a concentration distribution of the source region in the exemplary MOSFET thus obtained according to the embodiment of the present invention. The concentration distribution in this figure is measured for the n-type impurity along the line A–A' of FIG. 1. Broken line in FIG. 7 represents a concentration profile of the source region 104 in the comparison embodiment of the MOSFET shown in FIG. 10.

The source concentration in the comparison embodiment is constant at a level of approximately $1.4\times10^{19}$ cm$^{-3}$. The concentration required to make an ohmic contact between the source region and the source electrode, however, is about $3\times10^{19}$ cm$^{-3}$. The comparison embodiment is structured to have the source region 104 of the concentration that is insufficient to obtain the ohmic contact.

In the embodiment of the present invention, the concentration of the n⁺-type source region 4 is considerably low, or no more than about $5\times10^{18}$ cm$^{-3}$. On the contrary, the concentration of the n⁺⁺-type source region 4a is considerably high, or no less than about $5.5\times10^{19}$ cm$^{-3}$. Thus, the n⁺-type source region 4 has a reduced concentration relative to the source region 104 of the comparison embodiment, and this enables to attain an improved avalanche withstand voltage. The n⁺⁺-type source region 4a can raise the concentration level up to about $5.5\times10^{19}$ cm$^{-3}$ to ensure a creation of the ohmic contact with the source electrode 9, which, in turn, permits the device to have a reduced and stable ON-resistance.

The inventors attempted to make the test MOSFETs configured as in FIGS. 1 and 10, respectively, and twenty samples were randomly picked up for each type of the transistors to measure the avalanche tolerability to obtain statistical results.

FIG. 8 is a graph showing the evaluation results of the avalanche tolerability for the MOSFETs of the embodiment of the present invention and the comparison embodiment. In the graph, the number of the devices is represented along a horizontal axis while the avalanche tolerability is represented along a vertical axis. Measurements were carried out under the conditions where load inductance L=1 mH, $V_{DD}$= 24 V, $V_{CS}$=+15 V/0V, and $R_g$=25 Ω.

Figure 8A:
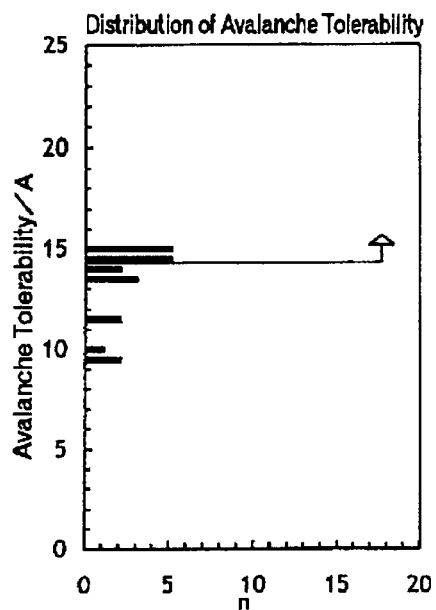
FIGS. 8A and 8B are graphs illustrating evaluation results for avalanche tolerability in comparison of the embodiment of the present invention with another MOSFET.

As shown in FIG. 8A, the sample devices of the comparison embodiment showed a dispersed distribution of the avalanche tolerability, and half the number (ten) of them showed the avalanche tolerability lower than a standard level or 14.2 A.

Figure 8B:
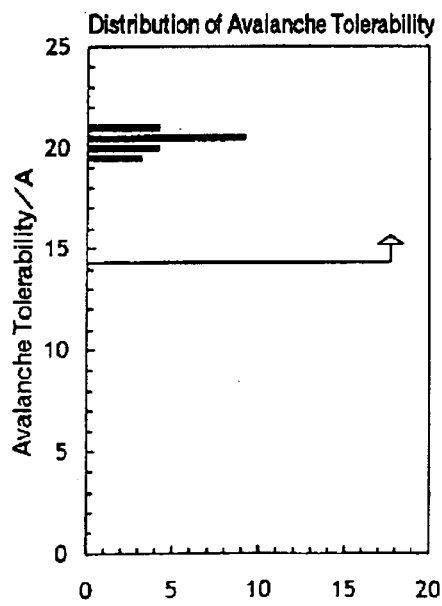

The sample devices of the embodiment according to the present invention, as recognized in FIG. 8B, showed a considerably tight distribution of the avalanche tolerability, and twenty of the devices were all higher in avalanche tolerability than the lower limit of the standard level or 14.2 A, and averaging their respective values got 20 A or above, which is a supreme level of the avalanche tolerability.

As a result of evaluating the trial sample embodied as in FIG. 8, it is found that the concentration of the n⁺-type source region should desirably keep $5\times10^{18}$ cm$^{-3}$ or below to ensure the avalanche tolerability at a sufficient level.

Then, the inventors randomly picked up twenty samples of the MOSFETs of each of the types configured as in FIGS. 1 and 10, respectively, and measured their respective ON-resistance values to obtain statistical results.

Figure 9A:
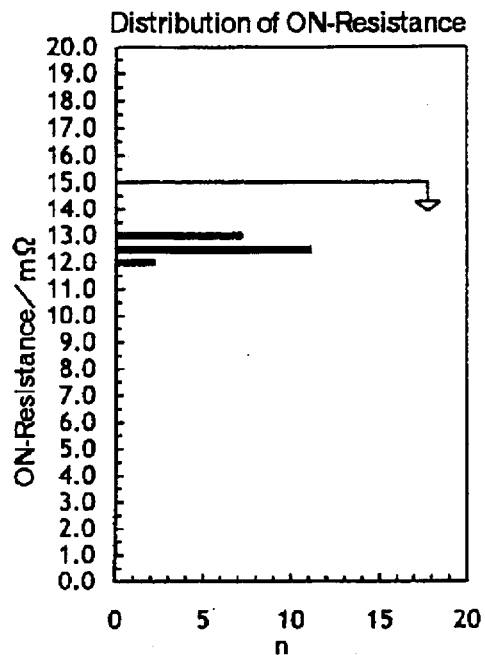
FIGS. 9A and 9B are graphs illustrating evaluation results for avalanche tolerability in comparison of the embodiment of the present invention with another MOSFET.
Figure 9B:
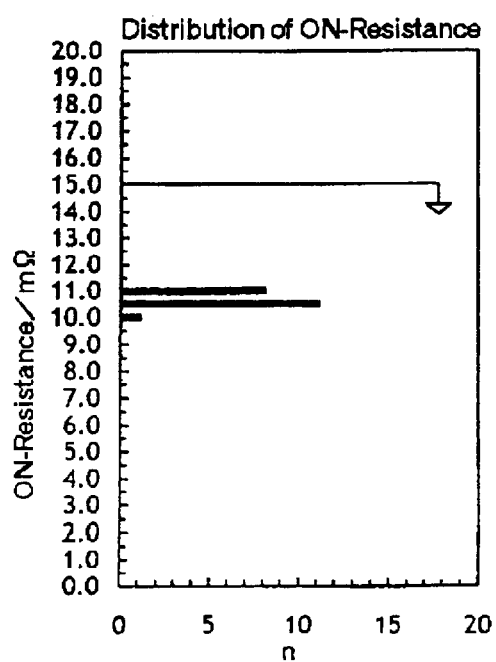

FIG. 9 is a graph showing the evaluation results of the avalanche tolerability in both the exemplary MOSFET of the embodiment of the present invention and the comparison MOSFET. The number of the devices is represented in a horizontal axis while the ON-resistance value is represented along a vertical axis. Measurements were carried out under the conditions where $V_{GS}$=4.5 V and $I_{DS}$=13A.

As shown in FIG. 8A, twenty of the devices of the comparison embodiment all showed the ON-resistance lower than the standard value or 15 mΩ, and averaging their respective ON-resistance values got 12.6 mΩ.

Twenty of the devices of the embodiment according to the present invention all showed a value lower than the lower limit of the standard ON-resistance level, and averaging their respective ON-resistance values got 10.7 mΩ, which is a considerable decrease compared to the average obtained from the comparison embodiment.

Although the preferred embodiment of the present invention has been described, referring to its examples, it is not intended that the invention should be limited to those examples.

Configuration, size, material composition, conductivity type, impurity of each component of the FET other than the aforementioned characteristics may be appropriately modified by any person skilled in the art, and it will be appreciated that such modifications should all be included in the scope of the present invention.

The present invention should not be limited to a precise form of the above-mentioned power MOSFET, but any device that can be applied to a wide range including a trench-gate switching device would, if attaining the similar effects, be also included in the scope of the present invention.

As has been described, the comparison embodiment of the trench-gate MOSFET is configured to have reduced base and trench depths for shortening a channel width, which results in its ON-resistance and capacitive property being improved. However, there still arises a problem that the concentration of the source region must be also reduced to obtain the avalanche tolerability at a satisfactory level. A reduction of the concentration in the source region causes a resistance to rise in a contact of the source electrode with the source region (ohmic malfunction), and this consequently leads to an increase in the ON-resistance. To avoid these complicated disadvantages of the comparison or prior art embodiment, the present invention provides an improvement where the source region has its selective portion increased in concentration so as to decrease a resistance in a contact of the source electrode with the source region, and such a reduction of the contact resistance helps to positively decrease the ON-resistance while the remaining part of the source region is reduced in concentration, so that the avalanche tolerability can be enhanced.

Thus, the present invention will offer a great benefit to the industry in that it positively improves both properties of the ON-resistance and the avalanche tolerability which seem essential among all other properties of the trench-gate MOSFETs.

While the present invention has been disclosed in terms of the embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A method of manufacturing a semiconductor device comprising:

forming a multi-layered structure including a semiconductor layer of a first conductivity type, a semiconductor region of a second conductivity type, a semiconductor region of a first conductivity type one over another in this order;

forming a trench which extends from the semiconductor region of the first conductivity type through the semiconductor region of the second conductivity type to the semiconductor layer of the first conductivity type;

forming an insulating layer over an inner wall of the trench;

embedding a conductor in a space defined by the insulating layer in the trench;

introducing impurity of the first conductivity type into part of a surface of the semiconductor region of the first conductivity, the part being apart from the trench, so as to from a region higher in concentration of which deepest level does not reach the underlying semiconductor region of the second conductivity type, partially etching away the region higher in concentration to expose the semiconductor region of the second conductivity type; and connecting an electrode to the region higher in concentration and to the exposed portion of the semiconductor region of the second conductivity type.

2. A method of manufacturing a semiconductor device according to claim 1, further comprising introducing impurity of the second conductivity type into the surface of the exposed portion of the semiconductor region of the second conductivity type.

3. A method of manufacturing a semiconductor device according to claim 1, wherein the forming the insulating layer over the inner wall the trench includes covering the surface of the semiconductor region of the first conductivity type with a insulating film.

4. A method of manufacturing a semiconductor device according to claim 3, further comprising removing part of the insulating film covering the surface of the semiconductor region of the first conductivity type, and introducing an impurity of the first conductivity type.

* * * * *

UNITED STATES PATENT AND TRADEMARK OFFICE
CERTIFICATE OF CORRECTION

PATENT NO. : 6,919,249 B2
DATED : July 19, 2005
INVENTOR(S) : Kawano et al.

It is certified that error appears in the above-identified patent and that said Letters Patent is hereby corrected as shown below:

<u>Title page, item [54] and Column 1, lines 1-2,</u>
Title, should read -- [54] SEMICONDUCTOR DEVICE AND ITS MANUFACTURING METHOD --.

Signed and Sealed this

Sixth Day of September, 2005

JON W. DUDAS
*Director of the United States Patent and Trademark Office*